United States Patent
Goda et al.

(10) Patent No.: US 8,174,893 B2
(45) Date of Patent: May 8, 2012

(54) INDEPENDENT WELL BIAS MANAGEMENT IN A MEMORY DEVICE

(75) Inventors: Akira Goda, Boise, ID (US); Tomoharu Tanaka, Kanagawa (JP); Krishna Parat, Palo Alto, CA (US); Prashant Damle, Santa Clara, CA (US); Shafqat Ahmed, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 389 days.

(21) Appl. No.: 12/582,458

(22) Filed: Oct. 20, 2009

(65) Prior Publication Data

US 2011/0090739 A1    Apr. 21, 2011

(51) Int. Cl.
*G11C 11/34* (2006.01)
(52) U.S. Cl. ......... 365/185.18; 365/185.17; 365/185.27; 365/189.09
(58) Field of Classification Search .............. 365/185.17, 365/185.18, 185.27, 189.09
See application file for complete search history.

(56) References Cited

U.S. PATENT DOCUMENTS

| | | | |
|---|---|---|---|
| 7,075,140 B2 | 7/2006 | Spadea | |
| 7,532,509 B2 | 5/2009 | Tanaka | |
| 7,616,489 B2 | 11/2009 | Yip | |
| 2008/0080244 A1* | 4/2008 | Lee et al. | 365/185.13 |
| 2008/0279012 A1* | 11/2008 | Lee | 365/185.19 |
| 2009/0003069 A1* | 1/2009 | Lee et al. | 365/185.17 |
| 2009/0122613 A1* | 5/2009 | Kim et al. | 365/185.17 |
| 2010/0195383 A1 | 8/2010 | Damle et al. | |
| 2010/0195399 A1 | 8/2010 | Tanaka | |

OTHER PUBLICATIONS

Akira Goda, "Memory Device Having Buried Boosting Plate and Methods of Operating the Same," unpublished patent application, U.S. Appl. No. 12/402,300, filed Mar. 11, 2009 (39 pages).

\* cited by examiner

*Primary Examiner* — Pho M Luu
*Assistant Examiner* — Thao Bui
(74) *Attorney, Agent, or Firm* — Leffert Jay & Polglaze, P.A.

(57) ABSTRACT

Methods for programming a memory device, memory devices configured to perform the disclosed programming methods, and memory systems having a memory device configured to perform the disclosed programming methods, for example, are provided. According to at least one such method, multiple independent semiconductor well regions each having strings of memory cells are independently biased during a programming operation performed on a memory device. Reduced charge leakage may be realized during a programming operation in response to independent well biasing methods.

32 Claims, 9 Drawing Sheets

US 8,174,893 B2

INDEPENDENT WELL BIAS MANAGEMENT IN A MEMORY DEVICE

TECHNICAL FIELD OF THE INVENTION

The present disclosure relates generally to semiconductor memories and, in particular, in one or more embodiments, the present disclosure relates to non-volatile memory devices.

BACKGROUND OF THE INVENTION

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Non-volatile memory is memory that can retain its stored data for some extended period without the application of power. Common uses for flash memory and other non-volatile memory include personal computers, personal digital assistants (PDAs), digital cameras, digital media players, digital recorders, games, appliances, vehicles, wireless devices, mobile telephones and removable memory modules, and the uses for non-volatile memory continue to expand.

Flash memory typically utilizes one of two basic architectures known as NOR Flash and NAND Flash. The designation is derived from the logic used to read the devices. FIG. 1 illustrates a NAND type flash memory array architecture 100 wherein the floating gate memory cells 102 of the memory array are logically arranged in an array of rows and columns. In a conventional NAND Flash architecture, "rows" refers to memory cells having commonly coupled control gates, while "columns" refers to memory cells coupled as a particular NAND string, for example. The memory cells 102 of the array are arranged together in strings (e.g., NAND strings), typically of 8, 16, 32, or more each. Memory cells of a string are connected together in series, source to drain, between a source line 114 and a data line 116, often referred to as a bit line. Each series string of memory cells is coupled to source line 114 by a source select gate such as 110 and to an individual bit line 116 by a drain select gate 104, for example. The source select gates, such as 110, are controlled by a source select gate control line SG(S) 112 coupled to their control gates. The drain select gates, such as 104, are controlled by a drain select gate control line SG(D) 106. The one or more strings of memory cells are also typically arranged in groups (e.g., blocks) in which the one or more strings coupled to multiple bit lines of a particular group are formed in a common p-well 140 formed in the substrate of the memory device. Due to this commonality of the p-well 140 between the one or more strings of memory cells, each p-well region near each of the memory cell strings has the same potential, such as 0V, or might be left floating, for example.

The memory array is accessed by a row decoder (not shown) activating a logical row of memory cells by selecting a particular access line, often referred to as a word line, such as WL7-WL0 $118_7$-$118_0$, for example. Each word line is coupled to the control gates of a row of memory cells. Bit lines BL1-BL4 $116_1$-$116_4$ can be driven high or low depending on the type of operation being performed on the array. As is known to those skilled in the art, the number of word lines and bit lines might be much greater than those shown in FIG. 1.

Memory cells 102 can be configured as what are known in the art as Single Level Memory Cells (SLC) or Multilevel Memory Cells (MLC). SLC and MLC memory cells assign a data state (e.g., as represented by one or more bits) to a specific range of threshold voltages (Vt) stored on the memory cells. Single level memory cells (SLC) permit the storage of a single binary digit (e.g., bit) of data on each memory cell. Meanwhile, MLC technology permits the storage of two or more binary digits per cell (e.g., 2, 4, 8, 16 bits), depending on the quantity of Vt ranges assigned to the cell and the stability of the assigned Vt ranges during the lifetime operation of the memory cell. The number of Vt ranges (e.g., levels), used to represent a bit pattern comprised of N-bits is $2^N$, where N is an integer. For example, one bit may be represented by two levels, two bits by four levels, three bits by eight levels, etc. MLC memory cells may store even or odd numbers of bits on each memory cell.

An MLC (four-level, e.g., 2-bit) memory cell might be assigned a Vt that falls within one of four different Vt ranges of 200 mV, each being used to represent a data state corresponding to a bit pattern comprised of two bits. Typically, a dead space (which is sometimes referred to as a margin) of 200 mV to 400 mV is maintained between each Vt range to keep the ranges from overlapping. As an example, if the voltage stored on a memory cell is within the first of the four Vt ranges, the cell in this case is storing a logical '11' state and is typically considered the erased state of the cell. If the voltage is within the second of the four Vt ranges, the cell in this case is storing a logical '10' state. A voltage in the third Vt range of the four Vt ranges indicates that the cell in this case is storing a logical '00' state. Finally, a Vt residing in the fourth Vt range indicates that a logical '01' state is stored in the cell.

FIG. 2 shows a side view of a single string of memory cells formed in a p-well 240 such as string 112 shown in FIG. 1, for example. The p-well 240 is also shown formed in an n-type well or a silicon-on-insulator (SOI) substrate 242 which are both known to those skilled in the art. The control gates of each memory cell are shown coupled to the word lines 118 as shown in FIG. 1. A source select gate 210 and drain select gate 204 are also illustrated.

FIG. 3 shows a view angle of the four NAND strings of memory cells. The view angle is that of looking into the NAND strings from a source select gate 310 viewpoint. FIG. 3 is shown in a simplified form to focus on the p-well structures and does not show the memory cells 102 of the array. Each NAND string might be formed in independent p-wells such as P+ regions $312_{1-4}$, for example. Other devices, such as described with respect to the common p-well 140 of FIG. 1, might have all of the NAND strings, formed not in individual p-wells as $312_{1-4}$, but instead share a common p-well as indicated by the dashed line 342.

Memory cells are typically programmed using erase and programming cycles. For example, memory cells of a particular block of memory cells are first erased and then selectively programmed. For a NAND array, a block of memory cells is typically erased by grounding all of the word lines in the block and applying an erase voltage to a semiconductor substrate on which the block of memory cells is formed, and thus to the channels of the memory cells, in order to remove charges which might be stored on the floating gates of the block of memory cells. This typically results in the Vt of memory cells to reside in the lowest Vt range (e.g., erased state), for example.

Programming typically involves applying one or more programming pulses to a selected word line and thus to the control gate of each memory cell coupled to the selected word line. Typical programming pulses start at or near 15V and tend to increase in magnitude during each programming pulse application. While the program voltage (e.g., programming pulse) is applied to the selected word line, a potential, such as a ground potential, is applied to the substrate, and thus to the channels of these memory cells, resulting in a charge transfer from the channel to the floating gates of memory cells targeted for programming. More specifically, the floating gates are typically charged through direct injection or Fowler-Nordheim tunneling of electrons from the channel to the floating gate, resulting in a Vt typically greater than zero in a programmed state, for example. In addition, an inhibit voltage is typically applied to bit lines not coupled to a NAND string containing a memory cell that is targeted for programming.

Typically, alternating bit lines are enabled and/or inhibited during a write (e.g., programming) and/or a read operation performed on a selected row of memory cells. During a programming operation, an effect which is known as program disturb can occur. For example, during a programming operation, some memory cells coupled to the selected word line may reach their assigned threshold voltage before other memory cells coupled to the same word line reach their assigned threshold voltages. This condition is especially likely to occur in MLC memory. The continued application of programming pulses (such as to complete programming of one or more memory cells of a row) to a selected word line can cause these program disturb issues. This is because memory cells which have reached their intended programming levels and are inhibited from programming can still experience a shift in their threshold voltage due to the continued application of programming pulses to the selected word line, for example. In particular, this can significantly affect inhibited memory cells which are in an erased state. In addition, memory cells coupled to unselected word lines can also experience program disturb in response to their proximity to a selected word line, for example. Undesirable leakage currents can also occur during a programming operation such as from the channel region of an unselected NAND string to the substrate and/or its associated bitline. These leakage currents can also contribute to program disturb effects.

For the reasons stated above, and for other reasons stated below which will become apparent to those skilled in the art upon reading and understanding the present disclosure, there is a need in the art for a way to manage substrate well biasing in a memory device in order to mitigate the effects of program disturb in flash memory devices.

DETAILED DESCRIPTION

Figure 1:
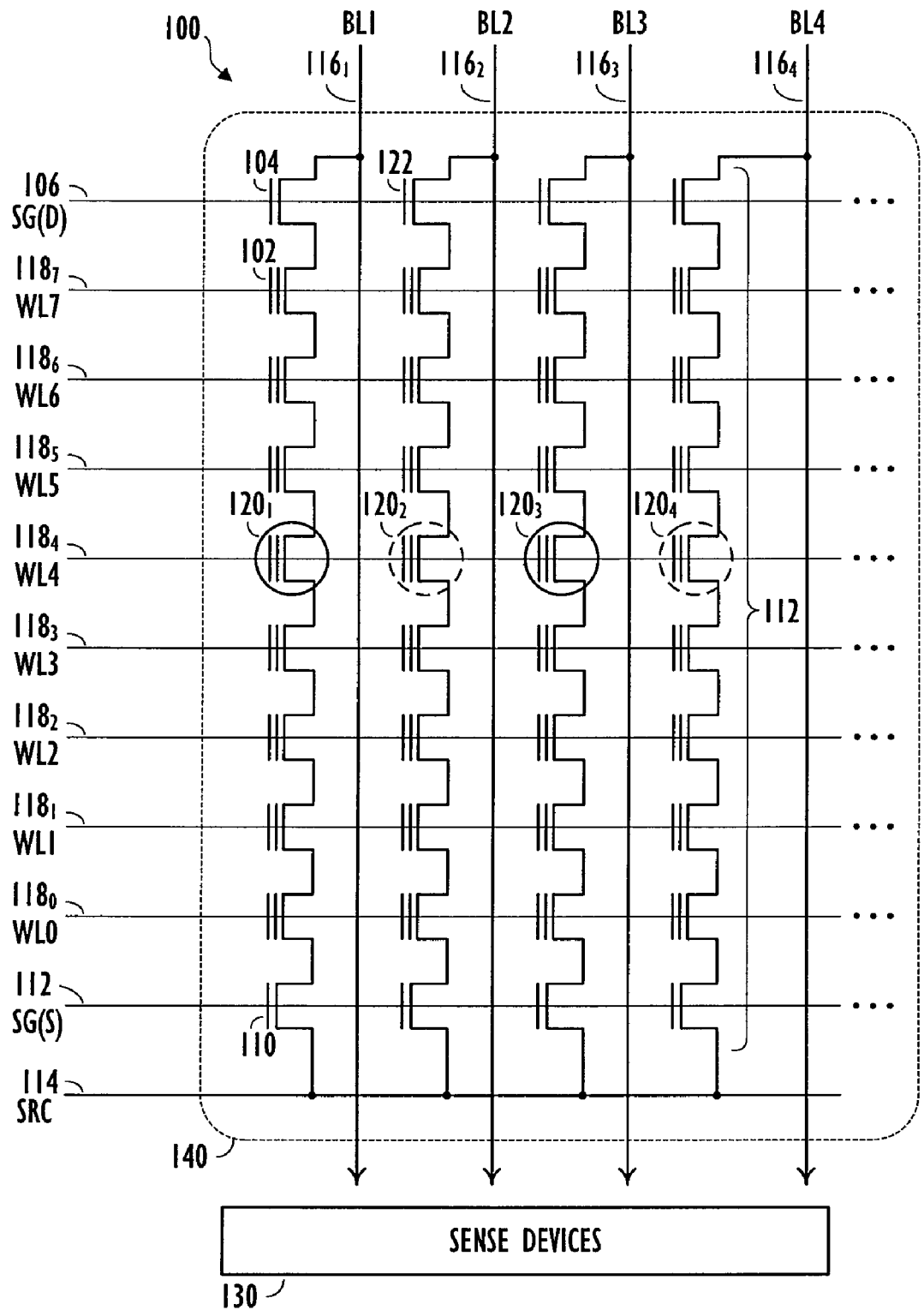
FIG. 1 shows an array of NAND configured memory cells.
Figure 2:
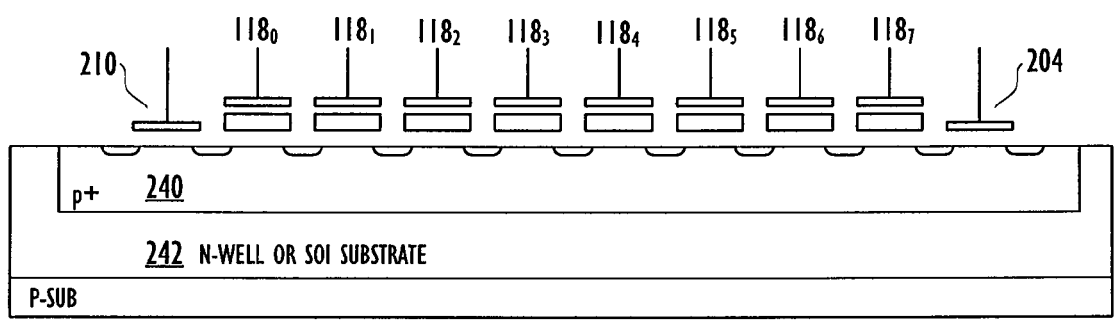
FIG. 2 shows an alternate view angle of an array of NAND configured memory cells.
Figure 3:
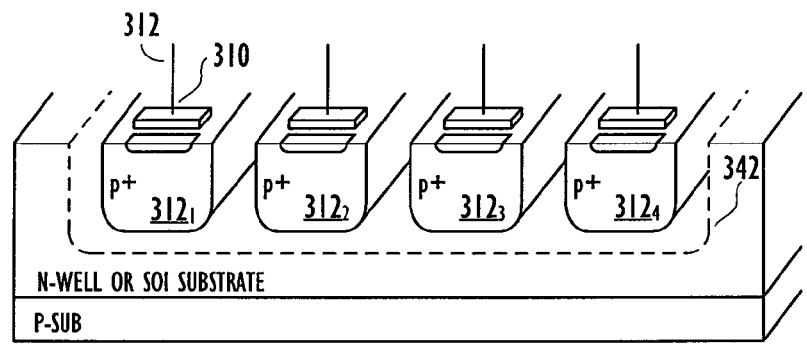
FIG. 3 shows another alternate view angle of an array of NAND configured memory cells.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof.

FIG. 1 further illustrates an example where a particular row of memory cells 120 coupled by WL4 118$_4$ has been selected for programming as indicated by the circles around the memory cells. During a typical programming operation, alternate bit lines are biased in such a way as to allow the programming of memory cells 120 coupled to alternating bit lines. For example, in a first programming operation of WL4 118$_4$, memory cells coupled to even numbered bit lines (e.g., indicated by dashed line circles surrounding memory cells 120$_{2,4}$) are programmed. During this operation, the odd numbered bit lines are biased such that the memory cells 120 coupled to the odd bit lines (e.g., indicated by solid line circles surrounding 120$_{1,3}$) are inhibited from programming. For example, the even numbered bit lines might be driven to a low (e.g., ground) potential and the odd bit lines might be driven to a non-zero potential, such as a supply voltage (Vcc.) Vcc according to one or more embodiments of the present disclosure might be 1.8V to 2.5V, for example. Following the programming operation of memory cells coupled to the even numbered bit lines, those bit lines are biased at a level (e.g., Vcc) to inhibit further programming of the memory cells coupled to those bit lines. The odd numbered bit lines are then biased (e.g., to 0V) to allow programming of memory cells 120$_{1,3}$ coupled to those bit lines.

During a typical read operation of the memory array 100, NAND strings of memory cells coupled to even numbered bit lines (e.g., BL2, BL4 116$_{2,4}$) are read, followed by a read operation of the NAND strings coupled to odd numbered bit lines (e.g., BL1, BL3 116$_{1,3}$.) During a read operation, bit lines coupled to memory cells selected to be read (e.g., even/odd) are precharged to a particular bias level, such as 0.5V, for example. A read operation may be performed on memory cells 120$_{1-4}$ of the row (e.g., word line) WL4 118$_4$, for example.

Bit lines BL1-BL4 116 are coupled to sense devices (e.g., sense amplifiers) 130 that detect the state of a target memory cell by sensing voltage or current on a particular bit line 116. Word lines WL7-WL0 118 select the individual memory cells (e.g., 120) in the series strings to be written to, verified or read from and operate the remaining memory cells in each series string in a pass through mode.

The memory cells of the selected row that are coupled to the odd bit lines can be considered a logical page of memory as are the memory cells of the selected row that are coupled to the even numbered bit lines. The two logical pages of memory cells are typically referred to as Page 0 and Page 1 of a particular row of memory cells. For example, the memory cells coupled to the odd numbered bit lines (e.g., indicated by solid line circles $120_{1,3}$) might be referred to as Page 0 memory cells, whereas the memory cells coupled to the even numbered bit lines (e.g., indicated by dashed line circles $120_{2,4}$) might be referred to as Page 1 memory cells, for example. Thus, during a typical programming operation, the Page 0 memory cells are programmed while the Page 1 memory cells are inhibited from programming. This is followed by a programming operation wherein the Page 0 memory cells are inhibited and the Page 1 memory cells are programmed. Enabling and inhibiting pages (e.g., Page 0, Page 1) of memory cells is accomplished, at least in part, by selectively biasing the bit lines 116 coupled to each page of memory cells.

Figure 4:
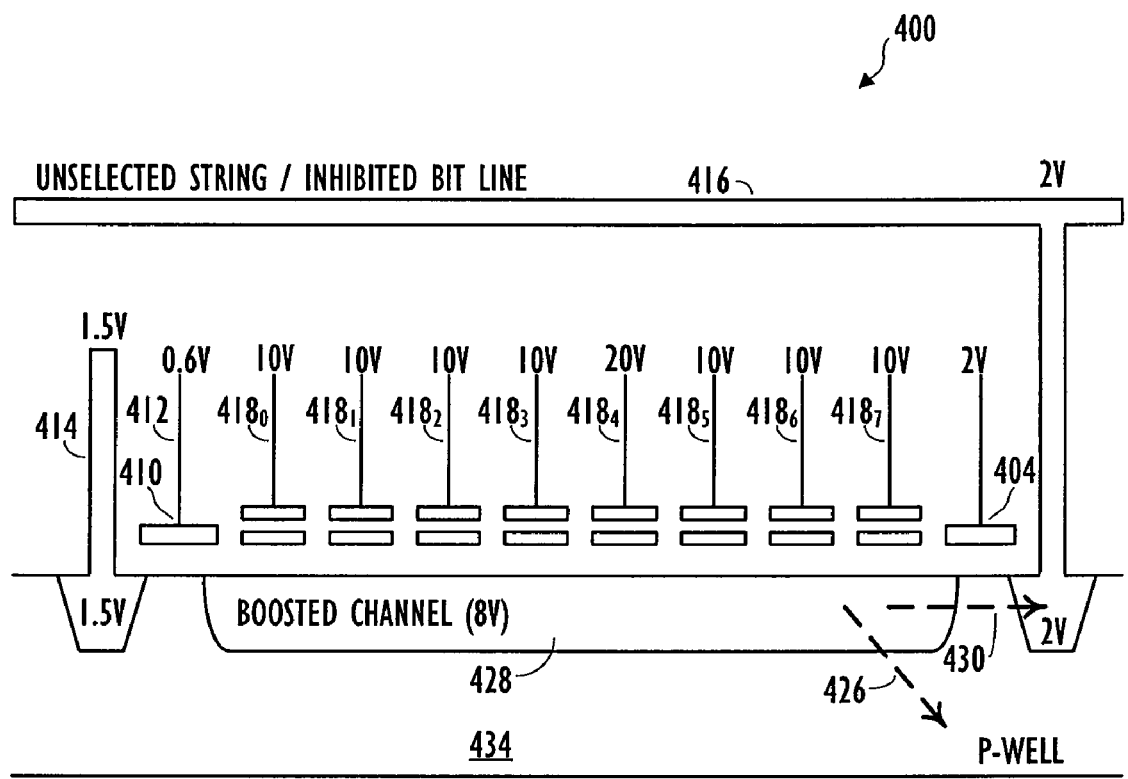
FIG. 4 shows a string of memory cells under program biasing conditions.

FIG. 4 illustrates potential charge leakage issues that can occur in an unselected string 400 of memory cells 402 during a programming operation performed on a nearby and/or adjacent string of memory cells. As discussed with respect to FIG. 1, a bit line 416 might be inhibited by applying a program inhibit voltage to the unselected bit line, such as 2V, for example. The unselected string 400 of memory cells 402 of FIG. 4 still experiences the pass voltage (e.g., 10V) and programming voltage (e.g., 20V) due to the commonality of word lines 418/118 coupled to rows of memory cells of the array. The channel region 428 under the unselected string is boosted up as a result of the off condition of the drain select gate 404 and the off condition of the source select gate 410. This boosted channel 428 might have a resultant bias of 8V, for example. This boosted channel region 428 is at a voltage typically high enough to prevent programming of the unselected memory cells. However, as the p-well 434 is typically left floating or might be biased to a ground state for example, charge leakage 426,430 from the boosted channel region can occur. For example, charge leakage 426 to the p-well 434 may occur due to the voltage difference between the boosted channel region and the p-well. Additional charge leakage 430 may occur between the boosted channel region 428 and the bit line 416. These charge leakages reduce the boosted bias level of the channel region 428. As a result, the unselected memory cells 402 might begin to experience program disturb effects due to this reduced channel bias. These effects can be mitigated by utilizing methods and memory devices according to various embodiments of the present disclosure.

Figure 5:
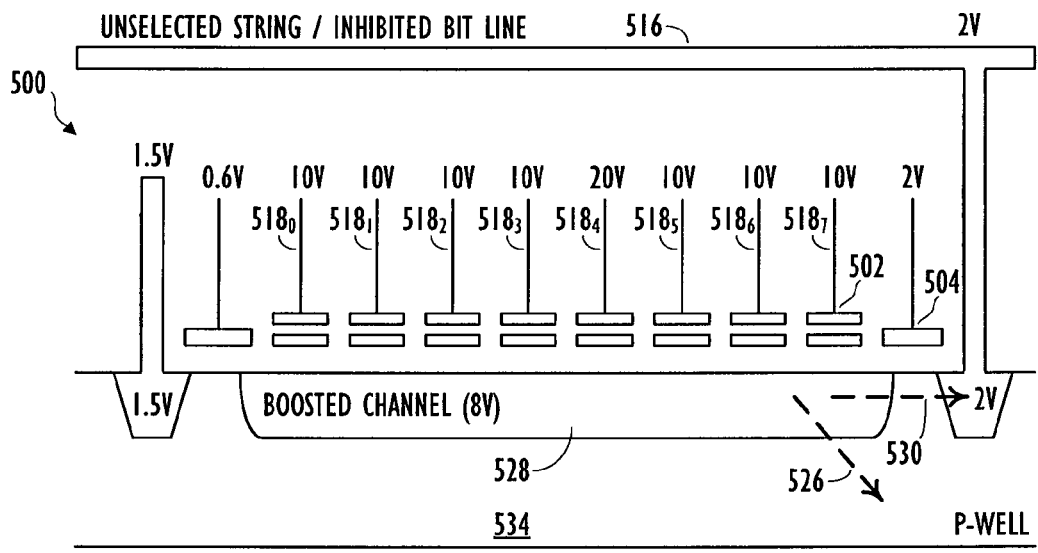
FIG. 5 shows a string of unselected memory cells under a program biasing scheme according to an embodiment of the present disclosure.
Figure 6:
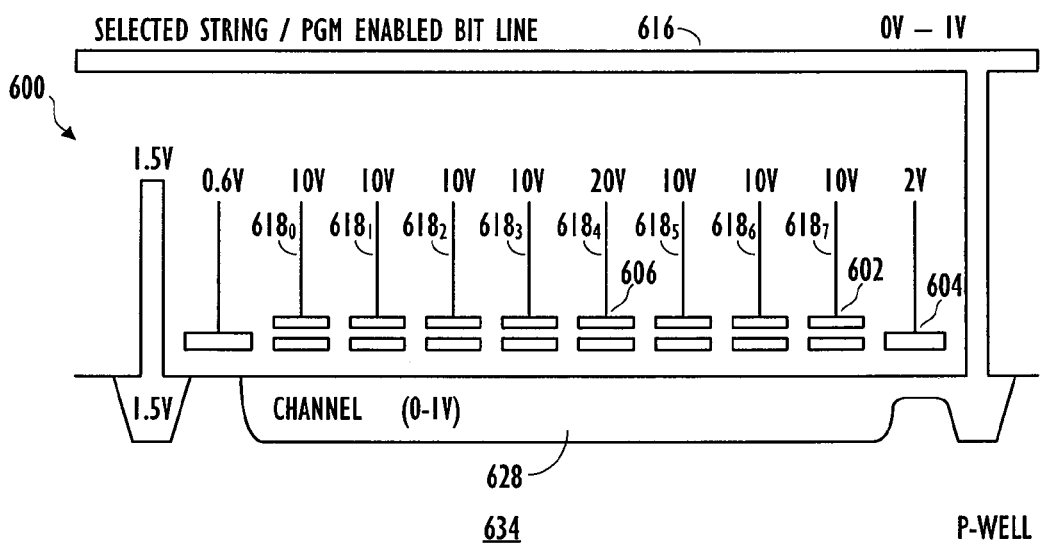
FIG. 6 shows a string of selected memory cells under a program biasing scheme according to an embodiment of the present disclosure.

The one or more embodiments of the present disclosure independently manage the substrate well (e.g., p-well) bias of each isolated well to mitigate the charge leakage effects such as boosted channel to bit line effects and boosted channel to p-well effects illustrated in FIG. 4, for example. FIG. 5 shows an unselected string of memory cells and FIG. 6 shows a selected string of memory cells. The strings shown in FIGS. 5 and 6 may or may not be adjacent to each other in the memory array. However, their word lines are coupled to each other by way of common rows of memory cells across the array. For example, word line $518_0$ is coupled by row to word line $618_0$, word line $518_1$ is coupled by row to word line $618_1$, etc. The p-well of FIG. 5 is isolated from the p-well of FIG. 6.

The one or more embodiments of the present disclosure allow for independently biasing the well under each string (e.g., selected and/or unselected) based on which charge leakage (e.g., channel to bit line and/or channel to well) path it is desirable to affect. For example, the p-well 534 might be biased to one of a range of voltages from 0V to 2V, for example. With respect to the bias conditions illustrated in FIG. 5, a p-well bias nearer to a 2V bias level will reduce the channel 528 to p-well charge leakage 526. Alternatively, a p-well bias nearer to a 0V bias level will reduce the channel 528 to bit line charge leakage 530, for example. Thus, the one or more embodiments allow for flexibility in addressing which charge leakage path to affect based on the well bias applied to each independent well.

FIG. 6 illustrates a string of memory cells wherein one of the memory cells has been selected for programming, such as memory cell 606 as indicated by the 20V programming voltage applied to word line $618_4$, for example. Various bit line programming enable voltages might be applied to the selected bit line. For example, the selected bit line might be biased to a bias level in the range of 0V to 1V, for example. The 0V to 1V present on the bit line allows the drain select gate 604 to bias the channel region 628 to the applied bit line bias level to enable programming. Selectively biasing the p-well of the selected string of memory cells to match the bit line bias level (e.g., 0V-1V) according to various embodiments of the present disclosure serves to improve the coupling effect of the bit line 616 to the channel region 628 by the drain select gate 604, for example. It should be noted that the bias levels illustrated in FIGS. 5 and 6 are meant to be illustrative and not limiting according to various embodiments of the present disclosure.

Figure 7:
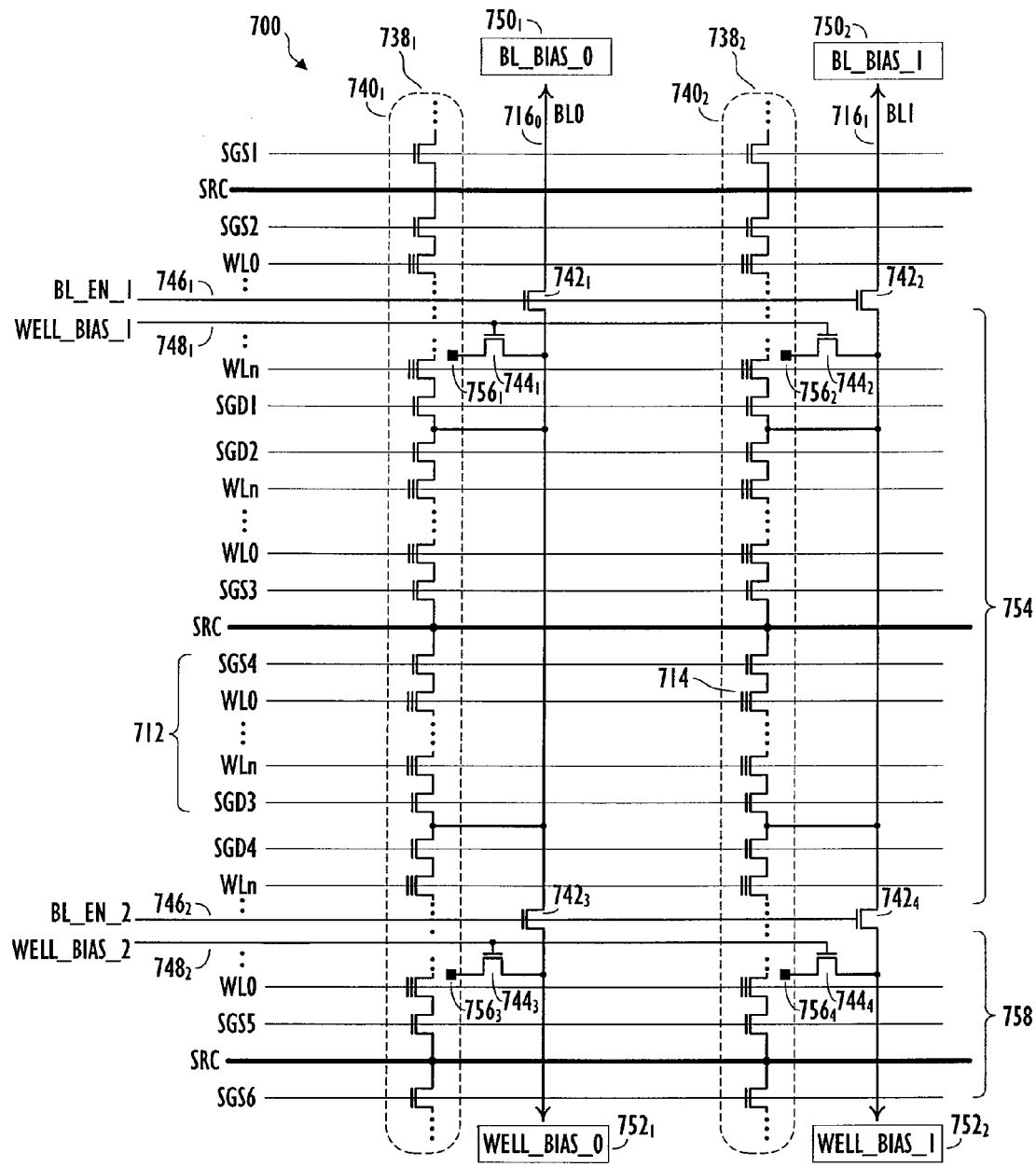
FIG. 7 shows a schematic representations of an array of memory cells according to an embodiment of the present disclosure.

FIG. 7 illustrates a schematic representation of an array 700 of memory cells configured so as to allow for independent biasing of isolated semiconductor wells (e.g., p-wells) according to one or more embodiments of the present disclosure. Each string of memory cells $738_1$, $738_2$ is shown formed in isolated p-wells $740_1$, $740_2$ respectively. This is in contrast to the common p-well 140 shown in FIG. 1, for example. Each string of memory cells $738_1$, $738_2$ is made up of multiple individual strings 712 of memory cells and their corresponding drain select and source select gates such as strings 112 illustrated in FIG. 1, for example. Two bit lines BL0 $716_0$ and BL1 $716_1$ are shown in FIG. 7. However, the one or more embodiments are not limited to the number of bit lines and strings of memory cells shown in FIG. 7. Each bit line $716_0$, $716_1$ is coupled at a first end to a BL_BIAS source 750 and at a second end to a WELL_BIAS source 752. Each bias source is configured to independently bias each end of a bit line to a particular bias level. According to one embodiment, the BL_BIAS sources $750_1$, $750_2$ might be combined with the sense devices circuitry 130 as shown in FIG. 1, for example. FIG. 7 also illustrates bit line select gates $742_1$-$742_4$ which are configured to decouple a bit line into one or more portions (e.g., segments.) For example, the bit line portion between select gates $742_2$ and $742_4$ can be considered a bit line segment 754 as the two bit line select gates $742_2$, $742_4$ can decouple (e.g., isolate) the bit line segment 754 from other portions (e.g., segment 758) of the bit line $716_1$, for example. Bit lines might have many more segments than those shown in the Figure according to various embodiments of the present disclosure.

Additional select gates 744 (e.g., well bias select gates $744_1$-$744_4$) are shown in FIG. 7 to allow a bit line segment to be coupled 756 to the associated p-well 740 of the bit line 716. For example, prior to performing a program operation on a selected memory cell 714, bit line select gate $742_4$ (and $742_3$)

can be disabled by the BL_EN_2 signal $746_2$. This effectively decouples the segment 758 of BL0 $716_1$ from the bit line portion between bit line select gate $742_4$ and BL_BIAS_1 bias source $750_2$. Well bias select gate $744_4$ (and $744_3$) can then be enabled by the WELL_BIAS_2 signal $748_2$. This couples the bit line segment 758 to the p-well $740_2$ at location $756_4$. This allows the WELL_BIAS_1 $752_2$ bias source to bias the p-well $740_2$ through segment 758 without any contention with the BL_BIAS_1 bias circuit $750_2$. It should be noted that the one or more embodiments of the present disclosure are not limited to the number of bit line and well bias select gates and bit line segments shown in FIG. 7.

Figure 8:
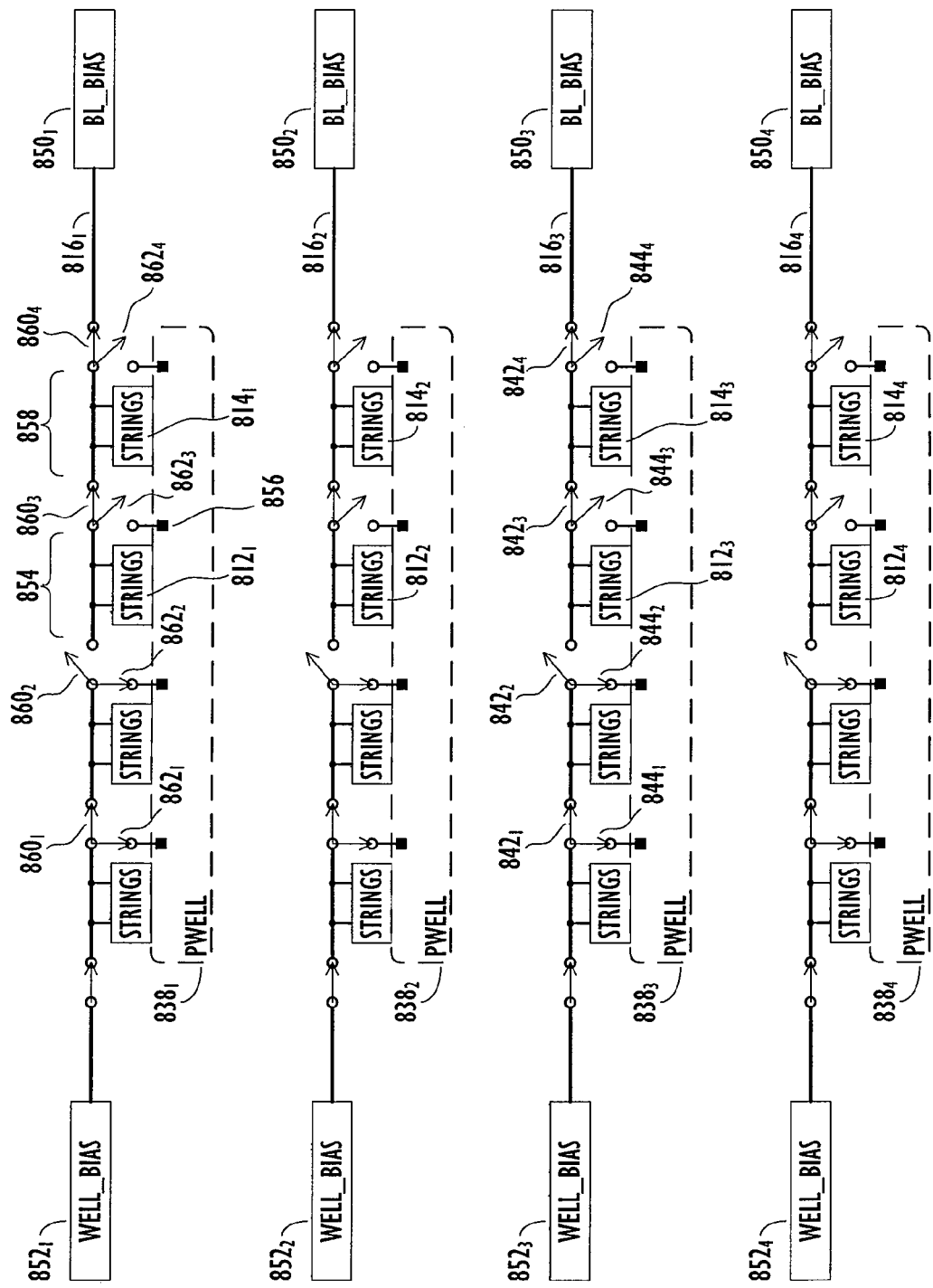
FIG. 8 shows a block diagram of multiple strings of memory cells according to an embodiment of the present disclosure.

FIG. 8 illustrates a graphical representation of an independent well biasing scheme according to one or more embodiments of the present disclosure. Each p-well $838_1$-$838_4$ is isolated from each other p-well $838_1$-$838_4$. In addition, each bit line $816_1$-$816_4$ is shown coupled at a first end to a WELL_BIAS source $852_1$-$852_4$ and at an opposing end to a BL_BIAS source $850_1$-$850_4$, respectively. FIG. 8 also illustrates how different segments (e.g., 854) can be isolated from other segments (e.g., 858) of the same bit line by selectively enabling (e.g., closing) and disabling (e.g., opening) the bit line select gates $860_1$-$860_4$. It is also shown that the well bias select gates $862_1$-$862_4$ can be selectively enabled (e.g., closed) to couple a particular segment 854 to the p-well $838_1$ at location 856, for example. Each block of strings 812 can comprise multiple strings of memory cells, drain select gates and source select gates such as string 712 shown in FIG. 7, for example. Although each block of strings 812 shows two direct connections to a bit line segment such as to segment 854, the one or more embodiments are not so limited. Additional detail of the blocks of strings 812 is shown and discussed subsequently with respect to FIG. 9.

The status shown (e.g., enabled, disabled) of each select gate 842, 844 of FIG. 8 illustrates a possible configuration for performing a programming operation on one or more memory cells of the memory strings 812. For example, bit line select gate $842_2$ is shown to be disabled (e.g., open) which decouples the WELL_BIAS source $852_3$ and BL_BIAS source $850_3$ from each other. Bit line select gates $842_3$ and $842_4$ remain in the enabled (e.g., ON) state so as to allow the BL_BIAS potential to reach the strings $812_3$ selected for programming. Well bias select gates $844_3$ and $844_4$ are in a disabled state (e.g., OFF). With the bit line select gate $842_2$ disabled, the bit line select gate $842_1$ enabled and the well bias select gate $844_2$ enabled, the WELL_BIAS source $852_3$ can drive a bias level into the p-well $838_3$ during the programming operation. As discussed above, each WELL_BIAS source 852 can drive its respective p-well 838 to different bias levels based on the operation to be performed. For example, the WELL_BIAS source $852_2$ might drive a 0V to 1V level on the p-well $838_2$ if a memory cell is to be programmed in the selected memory string $812_2$. Concurrently, WELL_BIAS source $852_3$ might drive a bias of 0V to 2V on to p-well $838_3$ if a string in block $812_3$ is to be inhibited from programming. During a subsequent programming operation the states of the select gates will change according to various embodiments of the present disclosure. For example, a subsequent programming operation might be performed on strings 814 for example. In this scenario (not shown), bit line select gate $842_2$ might be enabled (e.g., closed), bit line select gate $842_3$ might be disabled (e.g., open) and well bias select gate $844_3$ might be enabled to couple the WELL_BIAS source $852_3$ to the p-well $838_3$, for example.

Figure 9:
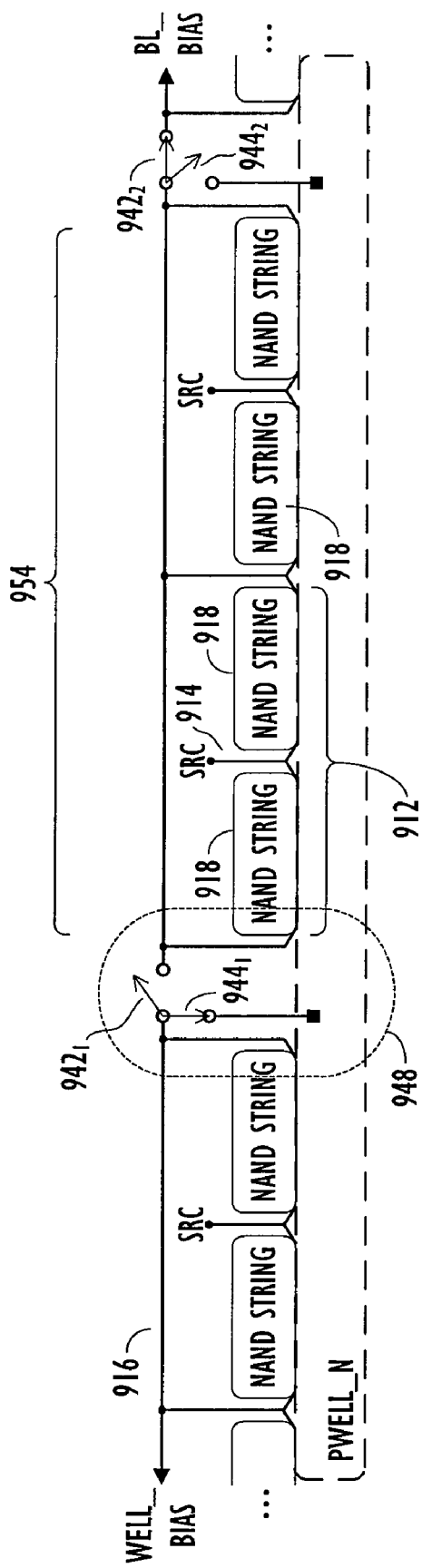
FIG. 9 shows an additional block diagram of a partial string of memory cells according to an embodiment of the present disclosure.

FIG. 9 illustrates further detail in the configuration of the strings of memory cells 918, such as the strings 812, 814 discussed with respect to FIG. 8, and their connections to segments 954 of a particular bit line 916. FIG. 9 further illustrates that according to one or more embodiments, NAND strings 918 are coupled to each other in pairs 912 where the connection between the two strings is coupled to a source SRC line 914, and the opposing ends of the string pair 912 are directly coupled to a segment 954 of bit line 916. Similarly to the bit line select gates 842 and the well bias select gates 844 shown in FIG. 8, the bit line select gates 942 and well bias select gates 944 can be enabled and/or disabled in response to a operation to be performed on the strings of memory cells such as 918, for example. The one or more embodiments are not limited to the number of string pairs 912 shown between select gates $942_1$ and $942_2$.

Figure 10:
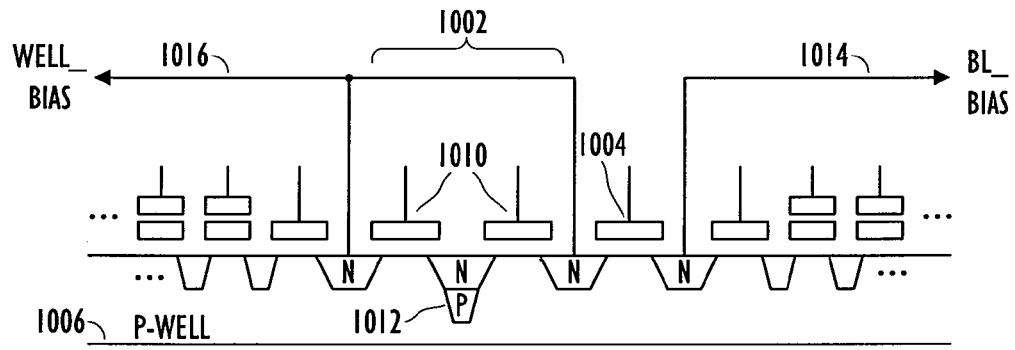
FIG. 10 illustrates a switching scheme according to an embodiment of the present disclosure.

FIG. 10 is a diagram showing an implementation of the select gates, such as 942 and 944 shown in the dashed oval 948 of FIG. 9, according to an embodiment of the present disclosure. For example, a well bias select gate can be implemented with two gates 1010 configured as shown at 1002 of FIG. 10. By enabling gates 1010, the WELL_BIAS source bias can be coupled to the p-well 1006 through the channels created below each transistor 1010 and through the "leaky" pn junction 1012. A bit line select gate can be implemented by the gate 1004 as shown in FIG. 10. Enabling gate 1004 couples the segment 1014 to the segment 1016. As a design note, it would likely be undesirable to enable both the well bias 1002 select gate configuration and the bit line select gate 1004 simultaneously.

Figure 11:
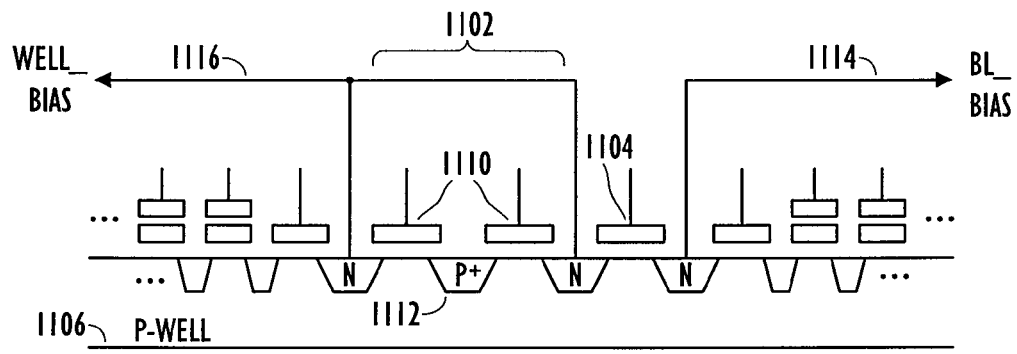
FIG. 11 illustrates an additional switching scheme according to an embodiment of the present disclosure.

FIG. 11 is a diagram showing an alternative implementation of the select gates, such as 942 and 944 shown in the dashed oval 948 of FIG. 9, according to one or more embodiments of the present disclosure. The bit line select gate 1104 of FIG. 11 is substantially similar to the configuration and functionality of bit line select gate 1004. Enabling gate (e.g., transistor) 1104 couples segment 1114 with segment 1116 allowing the BL_BIAS level to be passed through the gate 1104 and onto segment 1116. Implementation of the well bias select gate functionality 1102 again utilizes two transistors 1110 utilizing a P+ region 1112 creating a P+/N+ tunnel device. Thus, enabling transistors 1110 couples segment 1116, along with the WELL_BIAS potential, through the gate 1110 to the p-well 1106.

Figure 12:
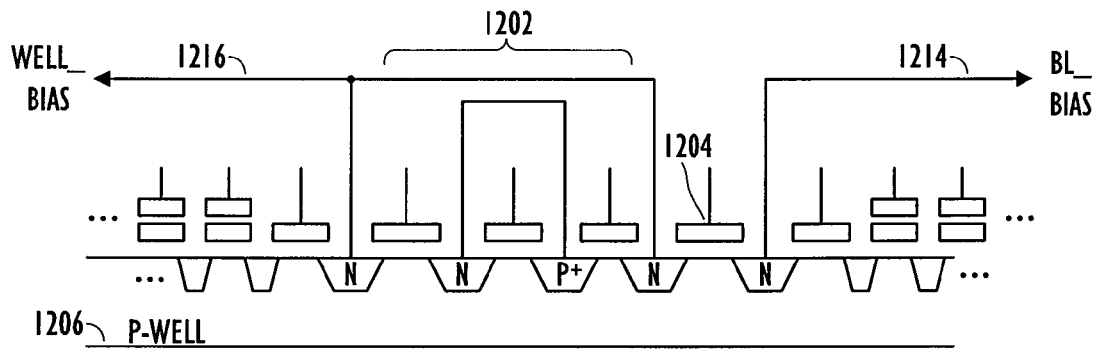
FIG. 12 illustrates an additional switching scheme according to an embodiment of the present disclosure.

FIG. 12 is a diagram showing an additional implementation of the select gates, such as 942 and 944 shown in the dashed oval 948 of FIG. 9, according to one or more embodiments of the present disclosure. Bit line select gate 1204 functions in a similar manner to that of bit line select gates 1004 and 1104 of FIGS. 10 and 11, respectively. Enabling gate 1204 couples the segment 1214 to segment 1216, and passes the BL_BIAS potential on to the segment 1216. Well bias select gate functionality 1202 utilizes a MOS switch configuration when enabled to couple segment 1216 to the p-well 1206. It should be noted with regard to FIGS. 10-12 that when enabling the bit line select gates 1004/1104/1204 in order to couple a BL_BIAS potential from segments 1014/1114/1214 onto segments 1016/1116/1216, respectively, either the WELL_BIAS source is not driving the 1016/1116/1216 segments and/or an additional bit line select gate (not shown) interrupts the 1016/1116/1216 segments to decouple the segments from the WELL_BIAS source to prevent contention between the BL_BIAS source and the WELL_BIAS source, for example.

Figure 13:
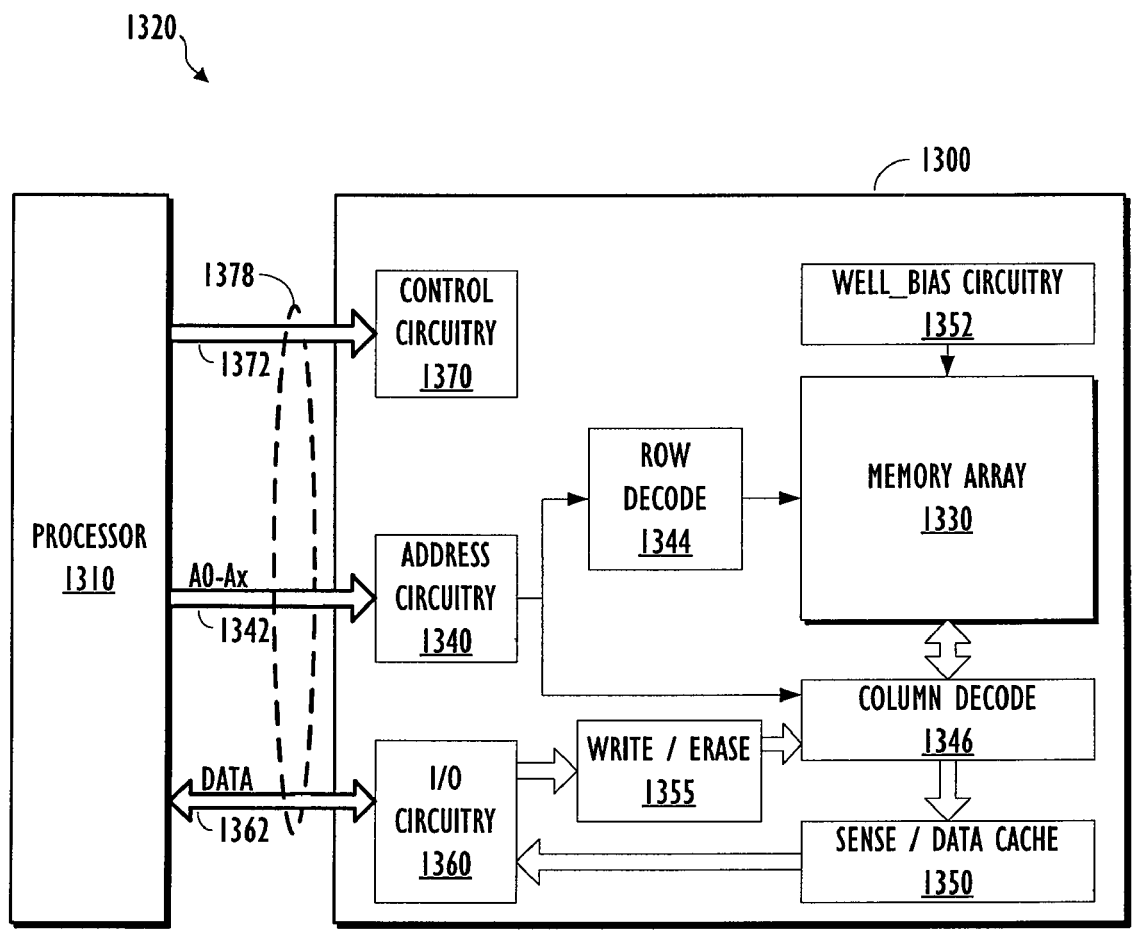
FIG. 13 illustrates a functional block diagram of a system according to an embodiment of the present disclosure.

FIG. 13 is a functional block diagram of an electronic system having at least one memory device according to one or more embodiments of the present disclosure. The memory device 1300 illustrated in FIG. 13 is coupled to a host such as a processor 1310. The processor 1310 may be a microprocessor or some other type of controlling circuitry. The memory device 1300 and the processor 1310 form part of an electronic system 1320. The memory device 1300 has been simplified to focus on features of the memory device that are helpful in understanding various embodiments of the present disclosure.

The memory device 1300 includes one or more arrays of memory cells 1330 that can be logically arranged in banks of rows and columns. Memory array 1330 may comprise SLC and/or MLC memory, for example. According to one or more embodiments, the memory cells of memory array 1330 are flash memory cells. The memory array 1330 might include multiple banks and blocks of memory cells residing on a single or multiple die as part of the memory device 1300. The memory cells of the memory array 1330 may also be adaptable to store varying densities (e.g., MLC (four level) and MLC (eight level)) of data in each cell, for example.

An address buffer circuit 1340 is provided to latch address signals provided on address input connections A0-Ax 1342. Address signals are received and decoded by a row decoder 1344 and a column decoder 1346 to access the memory array 1330. It will be appreciated by those skilled in the art, with the benefit of the present description, that the number of address input connections 1342 depends on the density and architecture of the memory array 1330. That is, the number of address digits increases with both increased memory cell counts and increased bank and block counts, for example.

The memory device 1300 reads data in the memory array 1330 by sensing voltage or current changes in the memory array columns using sense/data cache circuitry 1350. The sense/data cache/BL_BIAS circuitry 1350, in at least one embodiment, is coupled to read and latch a row of data from the memory array 1330. Sense devices such as sense devices 130 discussed with respect to FIG. 1 can also comprise the sense/data cache circuitry 1350, for example. Data input and output buffer circuitry 1360 is included for bi-directional data communication over a plurality of data connections 1362 with the processor 1310. Write/erase circuitry 1355 is provided to write data to or to erase data from the memory array 1330. Well bias circuitry 1352 is coupled to the array 1330 and is a source to allow for independent biasing of multiple isolated substrate wells (e.g., p-wells) according to various embodiments of the present disclosure.

Control circuitry 1370 is configured at least in part to implement various embodiments of the present disclosure, such as facilitating the methods discussed above with respect to FIGS. 5-12, for example. In at least one embodiment, the control circuitry 1370 may utilize a state machine. Control signals and commands can be sent by the processor 1310 to the memory device 1300 over the command bus 1372. The command bus 1372 may be a discrete signal or may be comprised of multiple signals, for example. These command signals 1372 are used to control the operations on the memory array 1330, including data read, data write (e.g., program), and erase operations. The command bus 1372, address bus 1342 and data bus 1362 may all be combined or may be combined in part to form a number of standard interfaces 1378. For example, the interface 1378 between the memory device 1300 and the processor 1310 may be a Universal Serial Bus (USB) interface. The interface 1378 may also be a standard interface used with many hard disk drives (e.g., SATA, PATA) as are known to those skilled in the art.

The electronic system illustrated in FIG. 13 has been simplified to facilitate a basic understanding of the features of the memory and is for purposes of illustration only. A more detailed understanding of internal circuitry and functions of non-volatile memories are known to those skilled in the art.

CONCLUSION

In summary, one or more embodiments of the present invention provide a method of independently biasing substrate wells wherein separate strings of memory cells are formed. These methods facilitate a reduction in the effects of program disturb on inhibited memory cells and leakage currents occurring from channel regions of unselected strings of memory cells during a programming operation.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of programming a memory device having a plurality of memory cells arranged in a series coupled string formed in a substrate well and wherein one end of the series coupled string is coupled to a data line, the method comprising:
   decoupling a first portion of the data line from a second portion of the data line and biasing the first portion of the data line to a first bias level;
   coupling the second portion of the data line to the substrate well and biasing the second portion of the data line to a second bias level; and
   applying a programming voltage to a memory cell of the string of memory cells.

2. The method of claim 1, wherein biasing the first portion of the data line to a first bias level further comprises biasing the first portion of the data line to a first bias level where the first bias level is a program inhibit bias level.

3. The method of claim 1, wherein biasing the first portion of the data line to a first bias level further comprises biasing the first portion of the data line to a first bias level where the first bias level is a program enable bias level.

4. The method of claim 1, wherein biasing the first portion of the data line to a first bias level and biasing the second portion of the data line to a second bias level further comprises biasing the first portion of the data line to a first bias level and biasing the second portion of the data line to a second bias level where the first bias level and the second bias level are equal.

5. The method of claim 1, wherein coupling the second portion of the data line to the substrate well further comprises enabling a gate coupling the second portion of the data line to the substrate well.

6. The method of claim 1, wherein applying a programming voltage to the memory cell further comprises applying a programming voltage to the memory cell where the memory cell is a memory cell selected to be programmed.

7. A method of programming a memory device having a plurality of memory cells arranged in a plurality of series coupled strings formed in a plurality of isolated substrate wells wherein one end of each of the plurality of series coupled strings is coupled to a respective data line and each data line is associated with an isolated substrate well, the method comprising:

decoupling a first portion of a first data line from a second portion of the first data line;

coupling the second portion of the first data line to the associated isolated substrate well and biasing the second portion of the first data line to a first bias level;

decoupling a first portion of a second data line from a second portion of the second data line;

coupling the second portion of the second data line to the associated substrate well and biasing the second portion of the second data line to a second bias level; and applying a programming voltage to a memory cell of a string of memory cells coupled to the first portion of the first data line and to a memory cell of a string of memory cells coupled to the first portion of the second data line.

8. The method of claim 7, wherein biasing to a first and second bias level further comprises biasing to a first and second bias level where the first and second bias levels are different bias levels.

9. The method of claim 7, further comprising independently biasing each first portion of each first data line to one of a program inhibit voltage and a program enable voltage.

10. A method of programming a memory device having a plurality of memory cells arranged in a plurality of strings where one or more strings are formed in each of a plurality of isolated p-wells, each p-well having an associated data line and each string of each isolated p-well coupled to the associated data line, the method comprising:

decoupling a first data line portion of each data line from a second data line portion of each data line and independently biasing each first data line portion of each data line;

coupling a second data line portion of each data line to the associated p-well of each data line and independently biasing each second data line portion of each data line; and applying a programming voltage to a memory cell of a string coupled to the first data line portion of each isolated p-well.

11. The method of claim 10, wherein independently biasing each first data line portion of each data line further comprises independently biasing each first data line portion of each data line to a voltage selected from a voltage range of 0V to 2V.

12. The method of claim 10, wherein independently biasing each second data line portion of each data line further comprises independently biasing each second data line portion of each data line to a voltage selected from a voltage range of 0V to 2V.

13. A memory device, comprising:

a plurality of data lines wherein each data line comprises one or more first select gates configured to selectively segment each data line into a first data line portion and a second data line portion;

a plurality of memory cells arranged in a plurality of strings of memory cells wherein one or more strings are formed in each of a plurality of isolated substrate wells and wherein each isolated substrate well has an associated data line;

one or more second select gates coupled to each of the plurality of data lines wherein each second select gate is configured to selectively couple a second data line portion to an associated substrate well;

data line bias circuitry configured to independently bias each first portion of each data line; and well bias circuitry configured to independently bias each second portion of each data line.

14. The memory device of claim 13, wherein the data line bias circuitry is further configured to independently bias each first portion of each data line to one of a program enable voltage and a program inhibit voltage.

15. The memory device of claim 13, wherein the well bias circuitry is further configured to independently bias each second portion of each data line to a voltage in a range of 0V to 2V.

16. The memory device of claim 13, wherein each of the plurality of substrate wells is a p-well formed in one of an n-type well and an SOI substrate.

17. The memory device of claim 13, wherein the one or more first select gates of each data line comprise a transistor gate formed on an associated isolated substrate well surface.

18. The memory device of claim 17, wherein the one or more second select gates coupled to each of the data line portions comprise one or more gates formed on an associated isolated substrate well surface and where each second select gate is adjacent to each of the first select gates of each data line.

19. The memory device of claim 13, wherein pairs of strings of memory cells are coupled to each other at a first end of each string of a pair and each second end of each string of memory cells of the pair is directly coupled to a data line segment.

20. The memory device of claim 19, wherein the first end of each string of memory cells of each coupled pair of strings of memory cells is further coupled to a source line of the memory device.

21. The memory device of claim 19, wherein at least two pairs of strings of memory cells are coupled to a data line segment between two first select gates of each data line.

22. The memory device of claim 13, wherein the one or more second select gates further comprises a first well connection gate and a second well connection gate wherein the first and the second well connection gate each have a first source/drain region which is a first common source/drain region formed in the associated substrate well.

23. The memory device of claim 22, and further comprising: a second source/drain region of the first well connection gate and a second source/drain region of the second well connection gate, each formed in the associated substrate well, wherein the second source/drain region of the first well connection gate is coupled to the second data line portion.

24. The memory device of claim 23, wherein the second source/drain region of the second well connection gate is coupled to the second data line portion.

25. The memory device of claim 23, wherein the second source/drain region of the first well connection gate and the second source/drain connection of the second well connection gate are n type regions formed in the associated substrate well.

26. The memory device of claim 23, wherein the first common source/drain region is a p type region formed in the associated substrate well.

27. The memory device of claim 23, wherein the first common source/drain region formed in the associated substrate well further comprises a p type region formed below and in contact with an n type region formed in the associated substrate.

28. The memory device of claim 23, wherein the one or more second select gates further comprises a third well connection gate wherein a first source/drain region of the third well connection gate is coupled to the second data line portion and a second source/drain region of the third well connection gate and the second source/drain region of the second well connection gate are a second common source/drain region.

29. The memory device of claim 28, wherein the first common source/drain region comprises a p type region formed in the associated substrate and the second common source/drain region comprises an n type region formed in the associated substrate.

30. A memory device, comprising:
- a plurality of data lines each data line comprising a plurality of data line segments each data line segment coupled to another data line segment by a data line select gate;
- an independent bias source coupled to each end of each data line;
- a plurality of memory cells arranged in a plurality of strings of memory cells wherein two or more strings are formed in each of a plurality of isolated p-wells and wherein each isolated p-well has an associated data line;
- wherein each data line segment of each data line is further coupled to an associated isolated p-well by a well bias select gate; and
- wherein each data line segment is coupled to at least two or more strings of memory cells.

31. The memory device of claim 30, wherein the independent bias source coupled to a first end of each data line is a data line bias source and the independent bias source coupled to a second end of each data line is a substrate well bias source.

32. The memory device of claim 31, further comprising control circuitry configured to disable a data line select gate of each data line, enable a well bias select gate coupled to a data line segment between the disabled data line select gate of each data line and the respective second end of each data line, and perform a program operation on one or more memory cells coupled to a data line segment between the disabled data line select gate of each data line and the respective data line bias source coupled to the first end of each data line.

* * * * *